(12) United States Patent
Ueno

(10) Patent No.: US 6,218,878 B1
(45) Date of Patent: *Apr. 17, 2001

(54) D-TYPE FLIP-FLOP CIRCIUT

(75) Inventor: Naoki Ueno, Tochigi-ken (JP)

(73) Assignee: Nippon Precision Circuits, Inc., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/061,528

(22) Filed: Apr. 16, 1998

(30) Foreign Application Priority Data

Jan. 25, 1997 (JP) .................................................. 108536/97

(51) Int. Cl.[7] .............................................. H03K 3/3562
(52) U.S. Cl. ........................................... 327/202; 327/203
(58) Field of Search .................................... 327/199, 200, 327/201, 202, 203, 208–212, 218

(56) References Cited

U.S. PATENT DOCUMENTS 4,560,888 * 12/1985 Oida ..................................... 327/202
5,239,206 * 8/1993 Yanai .................................... 327/202

FOREIGN PATENT DOCUMENTS 2-292910 * 12/1990 (JP) ..................................... 327/203
5-48402 * 2/1993 (JP) ..................................... 327/202
5-110389 * 4/1993 (JP) ..................................... 327/202

* cited by examiner

Primary Examiner—Tuan T. Lam
(74) Attorney, Agent, or Firm—Joel Lutzker; Donna Angotti; Eric Zyla

(57) ABSTRACT

There is provided a D-type flip-flop circuit which is improved in terms of operating frequency. First and second current supplying circuits are provided as sources for supplying currents to first and third differential circuits for inputting data and to second and fourth differential circuits for holding data in a master circuit and a slave circuit. Further, timing for supplying the currents to the respective differential circuits for inputting and holding data are controlled by first and second clock signals, respectively. The D-type flip-flop circuit is improved in terms of operating frequency by optimizing timing for writing input data and timing for holding data by arranging the first clock signal so as to have a certain delay with respect to the second clock signal. Further, the D-type flip-flop circuit is improved with respect to the operating frequency also by optimizing the value of the currents supplied to the respective differential circuits.

8 Claims, 16 Drawing Sheets

D-TYPE FLIP-FLOP CIRCIUT

BACKGROUND OF THE INVENTION

1. Field of the Invention

The present invention relates to a D-type flip-flop circuit.

2. Description of Related Art

Presently, while a frequency dividing circuit operable for higher frequency is desired in the technology of a PLL frequency synthesizer, a master-slave type D-type flip-flop circuit composed of bipolar transistors (hereinafter referred to simply as a transistor) is being used.

FIG. 16 shows a structure of such a D-type flip-flop circuit wherein a master circuit 161 comprises a differential circuit 162 for inputting data, a differential circuit 163 for holding data, a current supplying circuit 164 for supplying a current to the differential circuits 162 and 163 and a switching circuit 165 for alternately supplying the current to the differential circuits 162 and 163.

The differential circuit 162 comprises transistors q1 and q2 whose emitters are connected in common, whose bases receive data which are signals inverted from each other and whose collectors are set as outputs. It is noted that the collectors of these transistors q1 and q2 are connected to a source terminal VCC via resistors r1 and r2. While the differential circuit 162 receives input data which are signals inverted from each other via input terminals d1 and d2, it may also be a circuit in which one of the input terminals d1 and d2 is fixed to a reference potential. The differential circuit 163 comprises transistors q3 and q4 whose emitters are connected in common and whose bases and collectors are connected across each other. It is noted that the collectors of the transistors q3 and q4 of the differential circuit 163 are connected to the collectors of the transistors q1 and q2 of the first differential circuit 162, respectively, to receive and hold the outputs from the differential circuit 162. The current supplying circuit 164 comprises a transistor q5 which receives a current value setting signal from a current value setting terminal VCS at its base and whose emitter is connected to a source terminal GND. The switching circuit 165 comprises a pair of transistors q6 and q7 whose respective collectors are connected to emitter connecting points ce1 and ce2 of the respective differential circuits 162 and 163 and whose respective emitters are connected in common to a collector of the transistor q5 of the current supplying circuit 164. The transistors q6 and q7 turn on alternately and supply the currents to the differential circuits 162 and 163, respectively, by receiving clock signals which are inverted from each other at their bases via respective clock terminals cl1 and cl2.

A slave circuit 166 is also constructed in the same manner as the master circuit 161. Bases of transistors q8 and q9 of a differential circuit 167 for inputting data in the slave circuit 166 are connected to the collectors of the transistors q3 and q4 of the differential circuit 163 in the master circuit 161, respectively, to receive the output data held in the differential circuit 163. In the slave circuit 166, collectors of transistors q10 and q11 of a fourth differential circuit 168 for holding data are set as output terminals. A base of a transistor q12 of a current supplying circuit 169 is connected to the current value setting terminal VCS in common with the base of the transistor q5 of the current supplying circuit 164. Therefore, the currents having almost the same value are supplied to the respective differential circuits of the master circuit 161 and the slave circuit 166. A switching circuit 170 comprises transistors q13 and q14 whose respective collectors are connected to emitter connecting points ce3 and ce4 of the respective differential circuits 167 and 168 and whose respective emitters are connected in common to a collector of the transistor q12 of the current supplying circuit 169. The transistors q13 and q14 turn on alternately and supply the currents to the differential circuits 167 and 168, respectively, by receiving the clock signals at their bases via the clock terminals cl2 and cl1.

In the D-type flip-flop circuit in FIG. 16 constructed as described above, the first differential circuit 162 writes input data from the input terminals d1 and d2 in correspondence to "H", which means "high state" hereinafter, of the clock signal of the clock terminal cl1 and in the same time, the differential circuit 168 holds output data of the differential circuit 167. Following to that, in response to "H" of the clock signal of the clock terminal cl2 which is a signal inverted from the clock signal of the clock terminal cell, the differential circuit 163 holds the output data of the differential circuit 162 and at the same time, the differential circuit 167 writes in the output data of the differential circuit 162.

Here, the switching circuits 165 and 170 operate as follows. Timing of ON/OFF of the transistor q6 is simultaneous with that of the transistor q14 and timing of ON/OFF of the transistor q7 is simultaneous with that of the transistor q13. When the transistors q6 and q14 are ON, the transistors q7 and q13 are OFF and vice versa. They are turned ON/OFF simultaneously.

It is noted with regard to the expression of ON/OFF used here that although it is unable to clearly distinguish ON/OFF when frequency increases, it is expressed as "the transistor q6 is ON and the transistor q7 is OFF" in a state that "the transistor q6 turns ON strongly as compared to the transistor q7" even when the transistors q6 and q7 turn ON in the same time for example. The same can be said also in the embodiments described later.

However, the D-type flip-flop circuit shown in FIG. 16 has had a trouble in its operation in high frequency because it has not been able to compensate a propagation delay time due to its structure.

That is, in rewriting old data, which have been held in the differential circuit 163 while transistor q7 has been ON, with new (inverted) input data in response to the transistor q6 turning ON for example, the differential circuit 163 continues to hold the old data for a while even when the transistor q7 turns OFF and the transistor q6 turns ON in the same time because of the propagation time. Therefore, the new input data takes an extra load for inverting the old data. Although it is possible to write the data in a shorter time if it is written in a state in which there is no old data because it is not necessary to invert the data and it requires only a load for writing the data. Actually it takes a time to write the data because of the extra load and the writing operation cannot follow the clock signal as operating frequency increases.

SUMMARY OF THE INVENTION

Accordingly, it is an object of the present invention to improve a D-type flip-flop circuit with respect to operating frequency thereof.

According to the present invention, a source for supplying a current to respective differential circuits for inputting and holding data of a master circuit and a slave circuit is divided into a first current supplying circuit and a second current supplying circuit, respectively, and timing for supplying the current to the respective differential circuits for inputting and holding data is controlled by first and second clock signals. Then timing for writing input data and timing for holding data are optimized by arranging the first clock signal so as to have a predetermined delay with respect to the second clock signal, thus improving the D-type flip-flop circuit with respect to operating frequency thereof. In addition to that, the D-type flip-flop circuit is improved with respect to the operating frequency further by optimizing the value of current supplied to the respective differential circuits.

In concrete, the D-type flip-flop circuit comprises a master circuit having a first differential circuit for generating output data corresponding to input data and a second differential circuit for holding and outputting the output data from the first differential circuit; a slave circuit having a third differential circuit for generating second output data corresponding to the output data from the second differential circuit of the master circuit and a fourth differential circuit for holding and outputting the second output data from the third differential circuit; a first current supplying circuit for supplying a first current to the first and third differential circuits; a second current supplying circuit for supplying a second current to the second and fourth differential circuits; a first switching circuit for connecting the first and third differential circuits alternately to the first current supplying circuit by receiving a first clock signal; and a second switching circuit for connecting the second and fourth differential circuits alternately to the second current supplying circuit by receiving a second clock signal; and the first clock signal has a predetermined delay with respect to the second clock signal.

Preferably, the value of the second current is smaller than the value of the first current.

It is also preferable to arrange the circuit such that the second switching circuit starts to supply the current to the second differential circuit or the fourth differential circuit preceding to stopping to supply the current to the first differential circuit or the third differential circuit and stops to supply the current to the second differential circuit or the fourth differential circuit preceding to starting to supply the current to the first differential circuit or the third differential circuit in accordance to the second clock signal.

Further, it is preferable to arrange such that first and second emitter-follower circuits are provided between an output terminal of the first differential circuit and an input terminal of the second differential circuit and between an output terminal of the third differential circuit and an input terminal of the fourth differential circuit, respectively, and a signal which goes through the first emitter-follower circuit is input to the input terminal of the second differential circuit and a signal which goes through the second emitter-follower circuit is output.

The specific nature of the invention, as well as other objects, uses and advantages thereof, will clearly appear from the following description and from the accompanying drawings in which like numerals refer to like parts.

DESCRIPTION OF PREFERRED EMBODIMENTS

A D-type flip-flop circuit according to a first embodiment of the present invention will be explained below.

Figure 1:
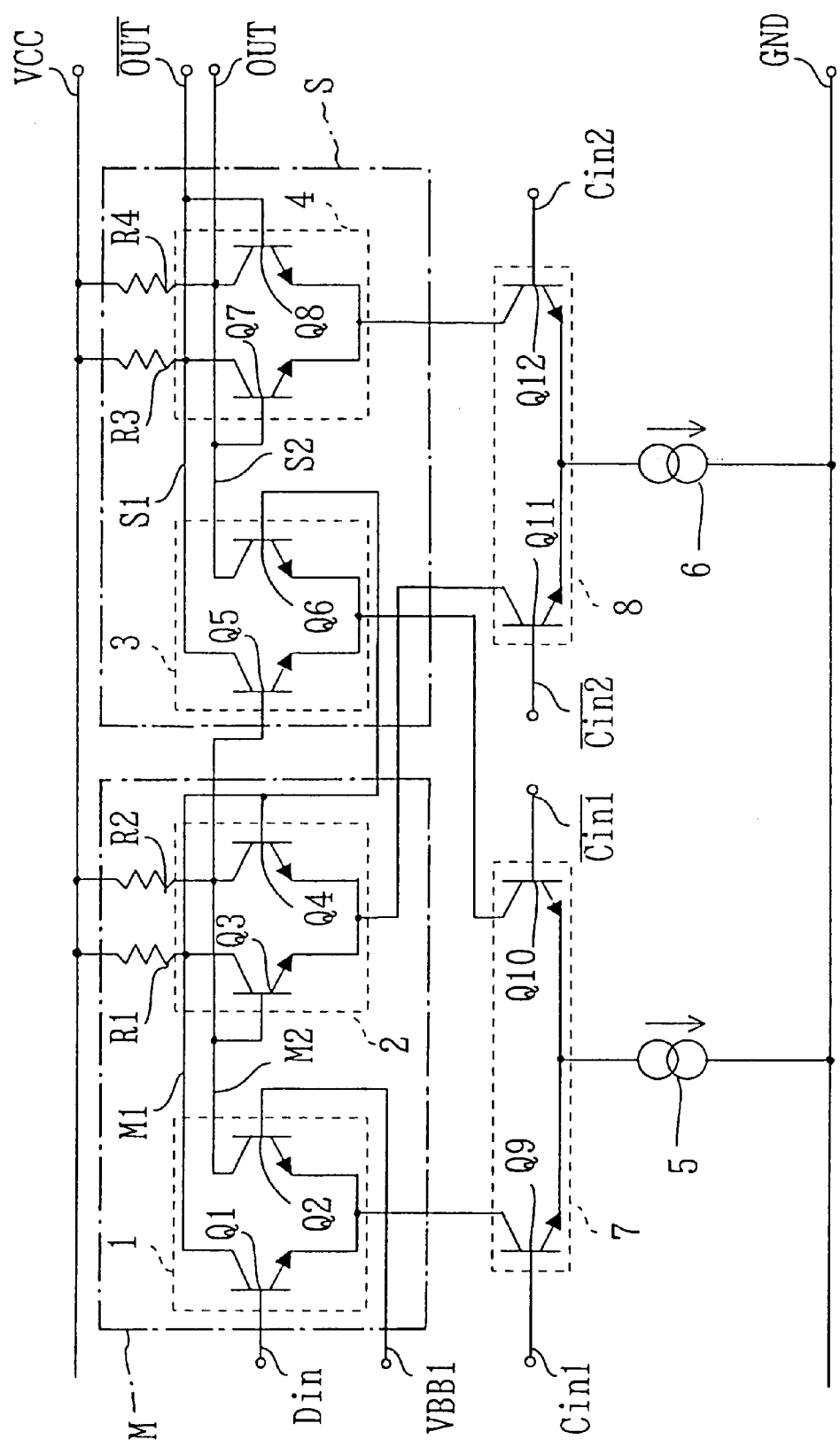
FIG. 1 is a circuit diagram for explaining a structure of a D-type flip-flop circuit according to a first embodiment of the present invention.

FIG. 1 is a circuit diagram showing a structure of the D-type flip-flop circuit of the present embodiment. The structure thereof will be explained at first with reference to the figure. A master circuit M comprises a first differential circuit 1 for inputting data and a second differential circuit 2 for holding data. A slave circuit S comprises a third differential circuit 3 for inputting data and a fourth differential circuit 4 for holding data. Here, the first differential circuit comprises transistors Q1 and Q2 whose emitters are connected in common, whose collectors are connected to a source terminal VCC via resistors R1 and R2, respectively, and whose bases receive signals from terminals Din and VBB1 as data, respectively. It is noted that the signal from the terminal VBB1 may be what is inverted from that from the terminal Din or one of them may be a reference potential. Here, assuming that a reference potential is applied to the terminal VBB1 and a current is being supplied to the first differential circuit, then the transistors Q1 and Q2 are turned ON and OFF, respectively, when the signal Din turns to "H" and are turned OFF and ON when the signal turns to "L" which means "Low state" hereinafter. Thereby, the transistors Q1 and Q2 are turned ON/OFF in response to the signal of the terminal Din, so voltage drops due to the respective resistors R1 and R2 from the potential of the source terminal VCC occur as outputs at the collectors, respectively. These output data corresponding to the input data from the terminal Din is written to terminals M1 and M2.

The second differential circuit 2 comprises transistors Q3 and Q4 whose emitters are connected in common and whose bases and collectors are connected across each other. The collector of the transistor Q3 and the base of the transistor Q4 receive the data on the terminal M1 and the collector of the transistor Q4 and the base of the transistor Q3 receive the data on the terminal M2, thus holding and outputting the data while the current is being supplied.

A third differential circuit 3 and a fourth differential circuit 4 of the slave circuit S are constructed in the same manner as the first differential circuit 1 and the second differential circuit 2, respectively. Bases of the transistors Q5 and Q6 of the third differential circuit 3 are connected with the terminals M2 and M1, respectively, to receive the respective data and to write output data corresponding to the output data from the second differential circuit 2 to terminals S1 and S2 connected to the respective collectors. Collectors of transistors Q7 and Q8 of the fourth differential circuit 4 are connected respectively with the terminals S1 and S2 which are provided with output terminals $\overline{\text{OUT}}$ and OUT, respectively. It is noted that the terminals S1 and S2 are connected to the source terminal VCC via resistors R3 and R4.

A first current supplying circuit 5 supplies a current for the first and third differential circuits 1 and 3 and a second current supplying circuit 6 supplies a current for the second and fourth differential circuits 2 and 4. Here, although these circuits are constant-current circuits comprising transistors and resistors similarly to the current supplying circuit shown in the aforementioned prior art example, the present invention is not limited only to such a circuit and one which is connected directly to a source terminal GND via a resistor may be adopted.

A switching circuit 7 is a differential circuit comprising transistors Q9 and Q10 whose emitters are connected in common to the first current supplying circuit 5, whose collectors are connected to emitter connecting points of the respective transistors of the first differential circuits 1 and 3 and whose bases are connected to clock terminals Cin1 and $\overline{\text{Cin1}}$ to receive a first clock signal and its inverted signal (or a reference potential) to supply the current alternately to the first and third differential circuits 1 and 3.

A switching circuit 8 is a differential circuit comprising transistors Q11 and 12 whose emitters are connected in common to the second current supplying circuit 6, whose collectors are connected to emitter connecting points of the respective transistors of the second and fourth differential circuits 2 and 4 and whose bases are connected to clock terminals Cin2 and $\overline{\text{Cin2}}$ to receive a second clock signal and its inverted signal (or a reference potential) to supply the current alternately to the second and fourth differential circuits 2 and 4.

Here, the first clock signal is arranged so as to have a predetermined delay with respect to the second clock signal. Thereby, a load in inverting data is lightened by finishing the data holding operation of the second and fourth differential circuits 2 and 4 earlier than causing the first and third differential circuits 1 and 3 to perform the writing operation. Further, the inverting and writing operations during writing may be also enhanced by starting the holding operation of the second and fourth differential circuits 2 and 4 just before finishing the writing operation of the first and third differential circuits 1 and 3. Such a delay time is set by each circuit component and the like.

Figure 2:
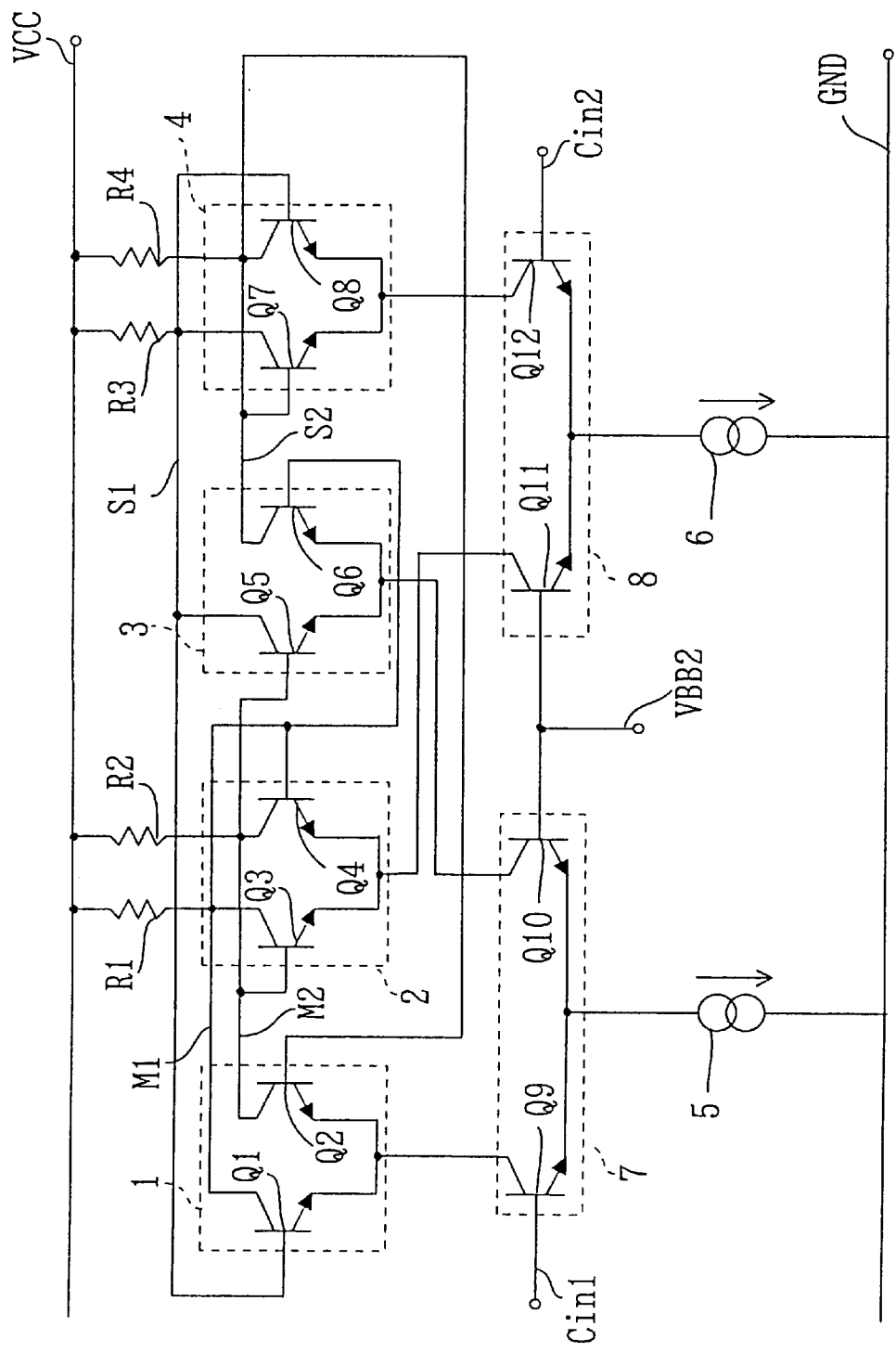
FIG. 2 is a circuit diagram for explaining operations of the D-type flip-flop circuit shown in FIG. 1.

Next, an operation of the present embodiment will be explained based on a ½ frequency dividing circuit as shown in FIG. 2 constructed by using the D-type flip-flop circuit of the present embodiment. It is noted that the same reference numerals in FIG. 2 with those shown in FIG. 1 denote the same components with those in FIG. 1. In the ½ frequency dividing circuit shown in FIG. 2 the terminal Din is connected with the output terminal $\overline{\text{OUT}}$ and the terminal VBB1 is connected with the terminal OUT in the D-type flip-flop circuit shown in FIG. 1. Further, a terminal VBB2 is connected with the clock terminals $\overline{\text{Cin1}}$ and $\overline{\text{Cin2}}$ to apply a common reference potential.

Figure 3:
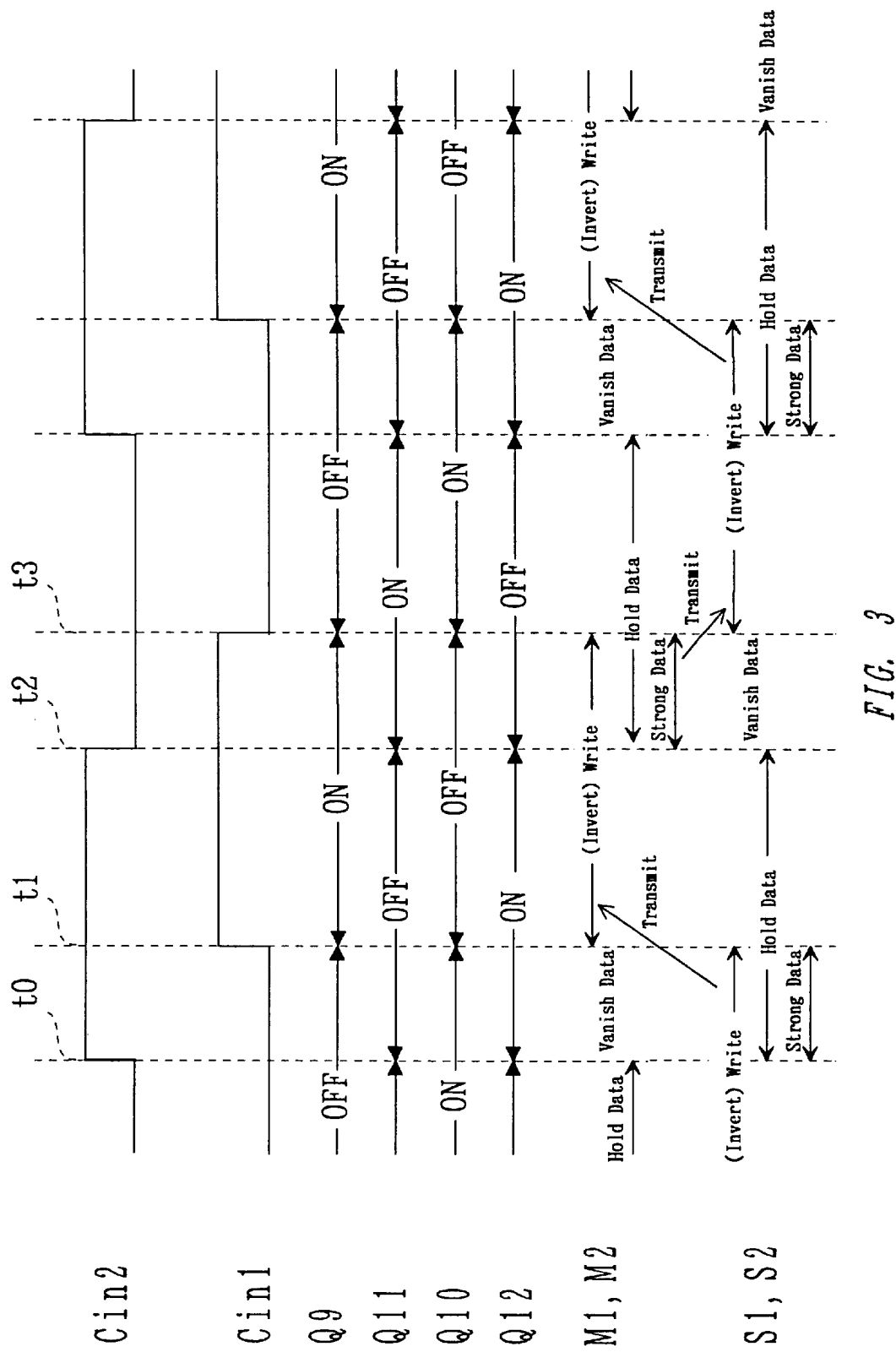
FIG. 3 is a timing chart for explaining the operations of the circuit shown in FIG. 2.

An operation of the ½ frequency dividing circuit shown in FIG. 2 will be explained with reference to a timing chart shown in FIG. 3. Cin1 and Cin2 in FIG. 3 represent first and second clock signals of the clock terminals Cin1 and Cin2, Q9 through Q12 represent ON/OFF states of the respective transistors Q9 through Q12 and M1, M2, S1 and S2 represent data writing and holding states at terminals M1 and M2 of the master circuit M and at terminals S1 and S2 of the slave circuit S, respectively.

When the second clock signal turns to "H" at timing t0, the transistors Q11 and Q12 are turned OFF and ON, respectively, stopping to supply the current from the second current supplying circuit 6 to the second differential circuit 2, and the data held in the terminals M1 and M2 are going to be vanished. Further, as the transistor Q12 is turned ON, the current is started to be supplied from the second current supplying circuit 6 to the fourth differential circuit 4, so the operation for holding data in the terminals S1 and S2 is started.

Next, when the first clock signal turns to "H" at timing t1, the transistors Q9 and Q10 of the first switching circuit 7 are turned ON and OFF, respectively, thus starting to supply the current from the first current supplying circuit 5 to the first differential circuit 1 and stopping to supply the current from the first current supplying circuit 5 to the third differential circuit 3. The data of the terminals S1 and S2 of the slave circuit S have been transmitted to the first differential circuit 1, so that the operation for writing them to the terminals M1 and M2 is started. For instance, when data "H" and "L" have been held in the terminals M1 and M2, an operation for inverting them is carried out by receiving the data of the terminals S1 and S2. However, because the data "H" and "L" in the terminals M1 and M2 are on the way of being vanished from timing t0, the load of the inverting operation at timing t1 is small, i.e. it becomes possible to write quickly. The writing operation of the third differential circuit 3 stops as the first differential circuit 1 starts to write.

Next, when the second clock signal turns to "L" at timing t2, the transistors Q11 and Q12 of the second switching circuit 8 are turned ON and OFF, respectively, starting to supply the current from the second current supplying circuit 6 to the second differential circuit 2 and stopping to supply the current to the fourth differential circuit 4. Thereby, the second differential circuit 2 starts to hold the data and, this holding operation and the writing operation of the first differential circuit 1 combine to write the data strongly to the terminals M1 and M2. In other words, the same data is written doubly. When the supply of the current to the fourth differential circuit 4 is stopped, the fourth differential circuit 4 stops the data holding operation and the data held in the terminals S1 and S2 are going to be vanished.

Next, when the first clock signal turns to "L" at timing t3, the transistors Q9 and Q10 of the first switching circuit 7 are turned OFF and ON, respectively, thus stopping the data writing operation of the first differential circuit 1 and starting the data writing operation of the third differential circuit 3. Further, while the data held in the terminals M1 and M2 of the master circuit M are transmitted to the third differential circuit 3, these data are transmitted favorably because these data have been written doubly between timings t2 and t3. Though the order of the explanation is reversed, the same can be said also in transmitting the data from the slave circuit S to the master circuit M at timing t1. Further, because the data held in the terminals S1 and S2 are on the way of being vanished from timing t2, the data favorably transmitted are written quickly. Thereafter, the series of operations at timings to through t3 are repeatedly performed.

As described above, the writing operation can be performed steadily because the old data is vanished before the new data is written both in the master circuit M and the slave circuit S and the transmitting side writes the same data doubly. These two actions allow the data to be transmitted favorably which has been impossible in the prior art circuit. A favorable output waveform is obtained and the ½ frequency dividing circuit can be operated at a high operating frequency.

Figure 4:
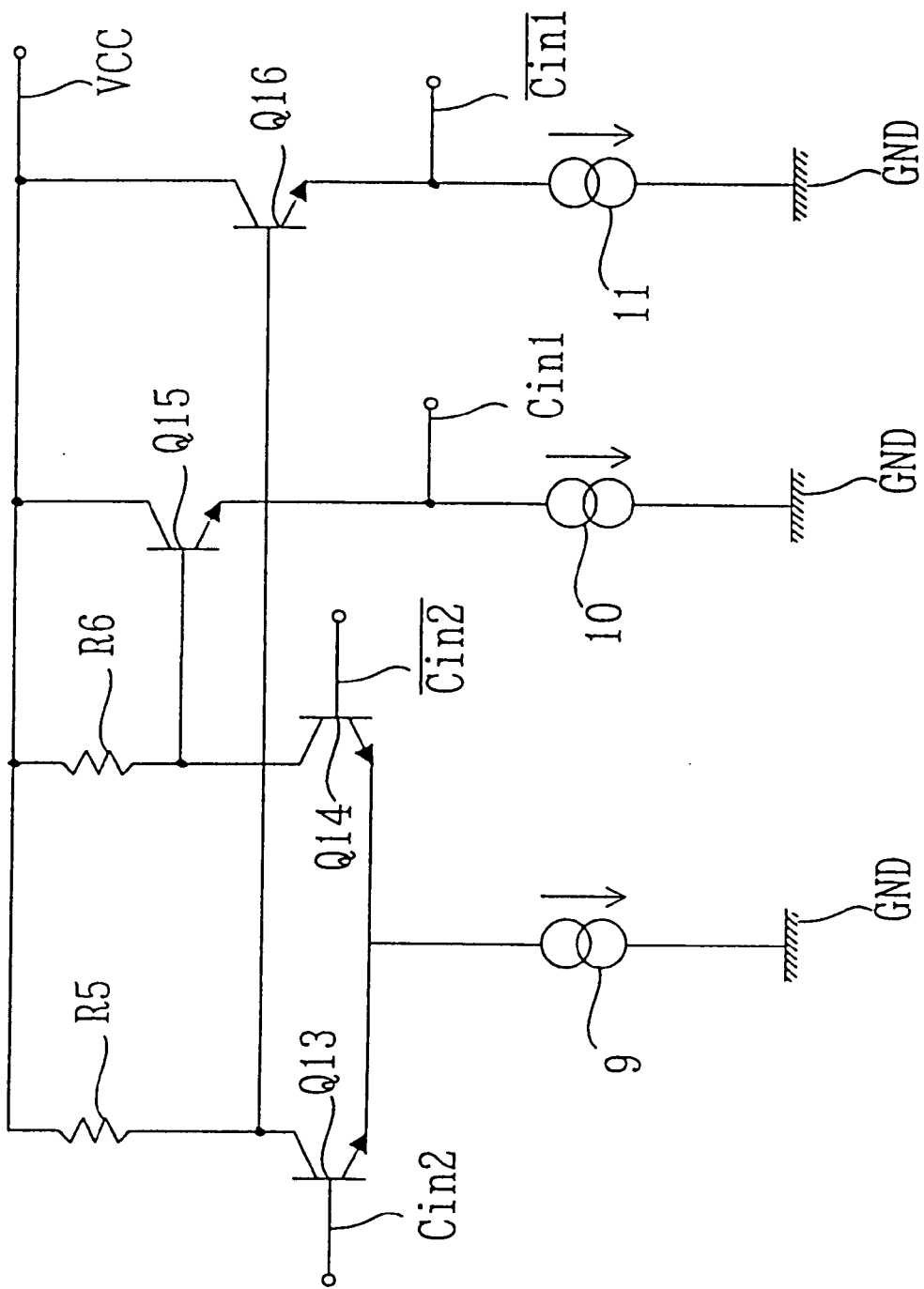
FIG. 4 is a circuit diagram for explaining the operations of the D-type flip-flop circuit shown in FIG. 1.

It is noted that while the operation of the present embodiment is made possible by utilizing the propagation delay time, a data vanishing period becomes too long and data is vanished when the delay between the first and second clock signals is too large. It is no different from causing a clock skew. Therefore, it is desirable to take the delay between the first and second clock signals as a fixed value, not by frequency. A circuit as shown in FIG. 4 is used for example as such a delay stage. It is constructed as a differential circuit comprising transistors Q13 and Q14 whose emitters are connected commonly to a current supplying circuit 9, whose collectors are connected to the source terminal VCC via resistors R5 and R6 and whose bases are applied with the second clock signal and its inverted signal. A connecting point of the collector of the transistor Q14 and the resistor R6 is connected to a base of a transistor Q15 and an amplifier circuit (emitter-follower circuit) composed of the transistor Q15 and a current supplying circuit 10 generates a signal from the terminal Cin1 as the first clock signal by receiving the state of the connecting point of the collector and the resistor. Further, a connecting point of the collector of the transistor Q13 and the resistor R5 is connected to a base of a transistor Q16 and an amplifier circuit (emitter-follower circuit) composed of the transistor Q16 and a current supplying circuit 11 generates an inverted signal of the first clock signal from the terminal $\overline{Cin1}$ by receiving the state of the connecting point of the collector and the resistor. That is, the delay between the first and second clock signals is decided by setting the delay of these amplifier circuits.

Next, a result of simulation carried out on the ½ frequency dividing circuit shown in FIG. 2 will be described. The result of simulation carried out on the ½ frequency dividing circuit using the prior art D-type flip-flop circuit for the purpose of comparison will be also described. In concrete, one which had been modified from the ½ frequency dividing circuit shown in FIG. 2 such that the collector of the transistor Q10 is connected to the second differential circuit 2, instead of the third differential circuit 3, the collector of the transistor Q11 is connected to the third differential circuit 3, instead of the second differential circuit 2, and the first clock signal is applied, instead of the second clock signal, to the terminal Cin2 has been used as the prior art circuit as shown in FIG. 5.

Figure 5:
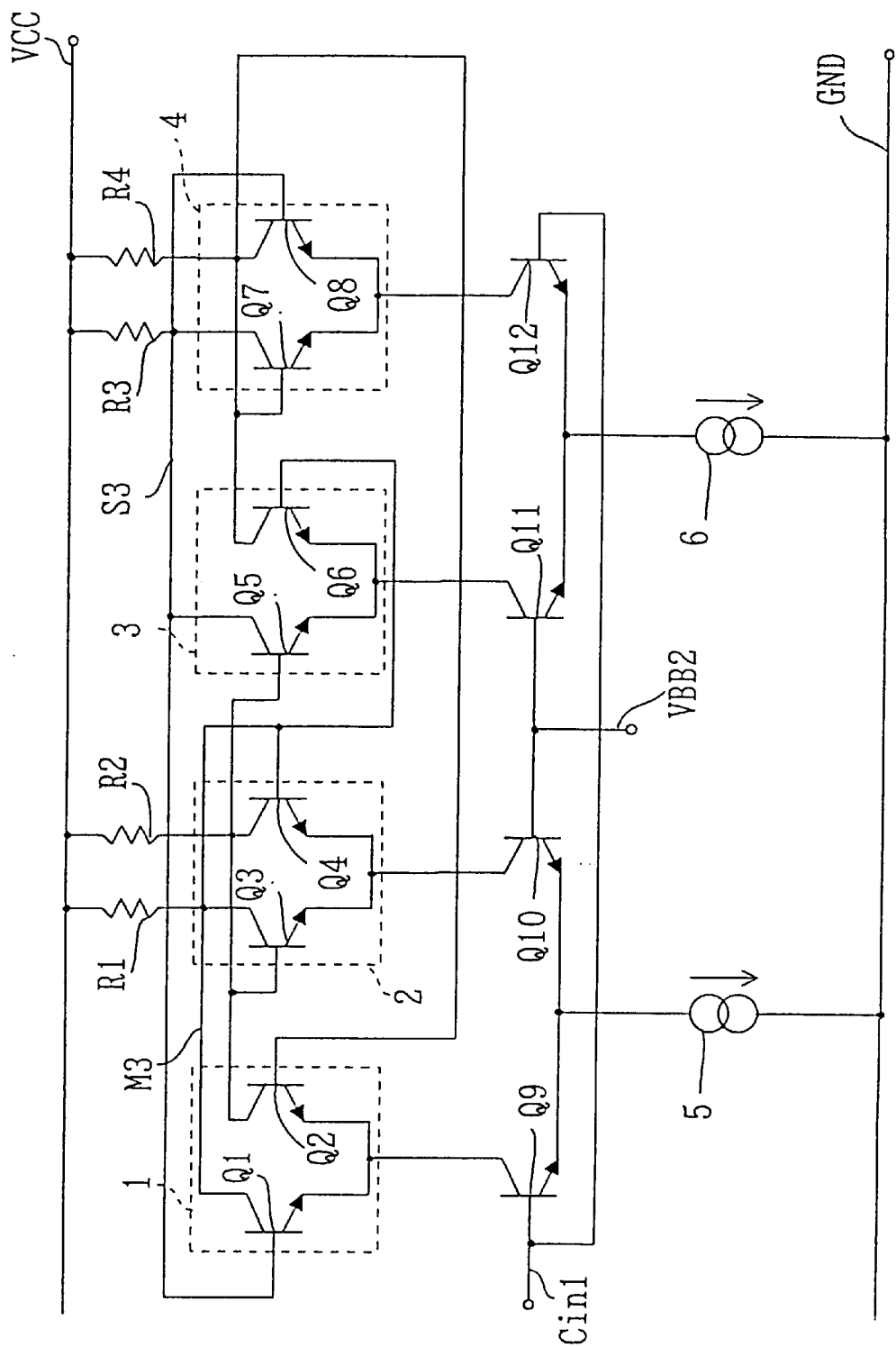
FIG. 5 is an explanatory circuit diagram showing a structure in which a prior art D-type flip-flop circuit is applied to such a ½ frequency dividing circuit shown in FIG. 2.
Figure 6:
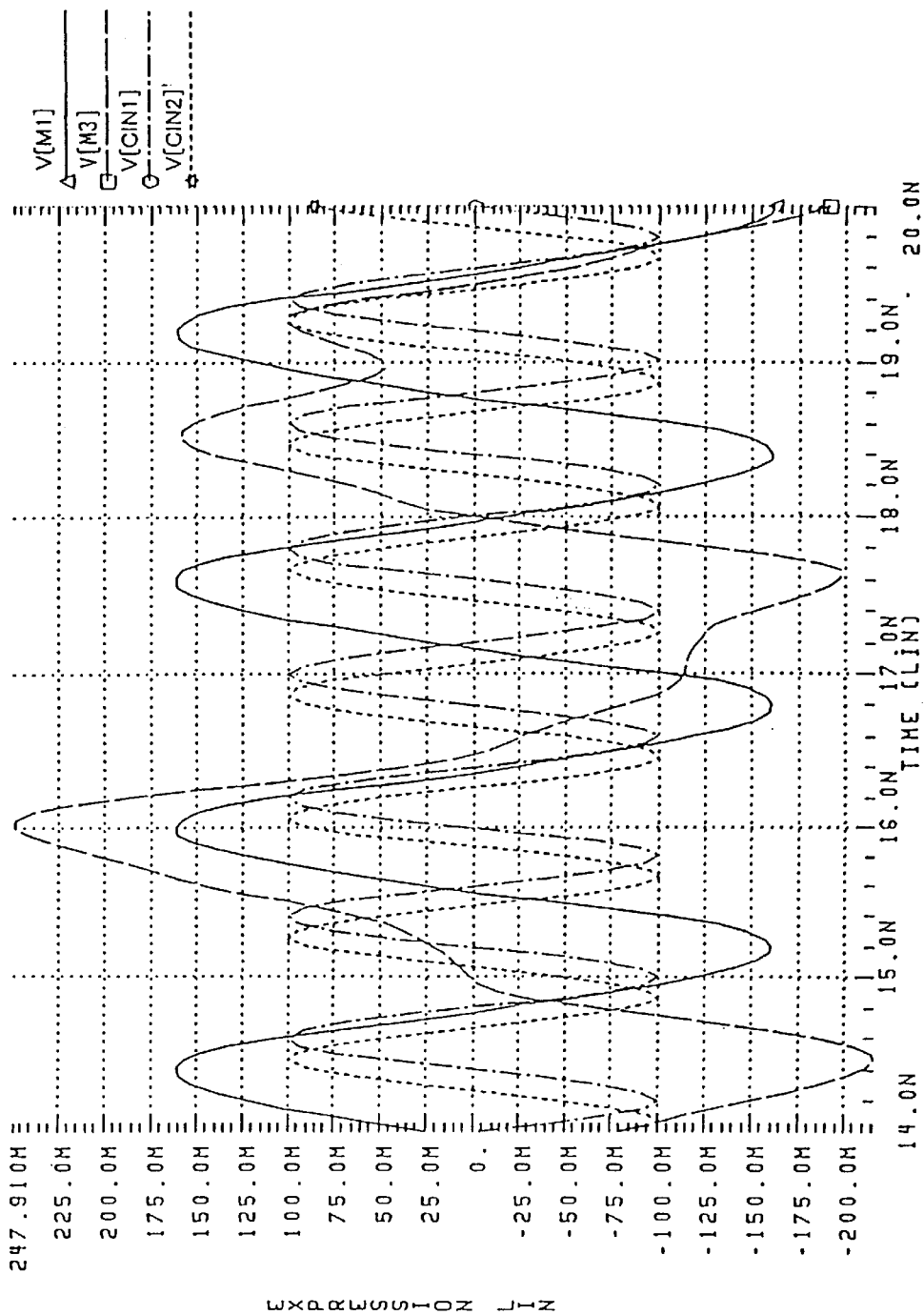
FIG. 6 is a waveform chart for explaining the operations of the circuits shown in FIGS. 2 and 5.
Figure 7:
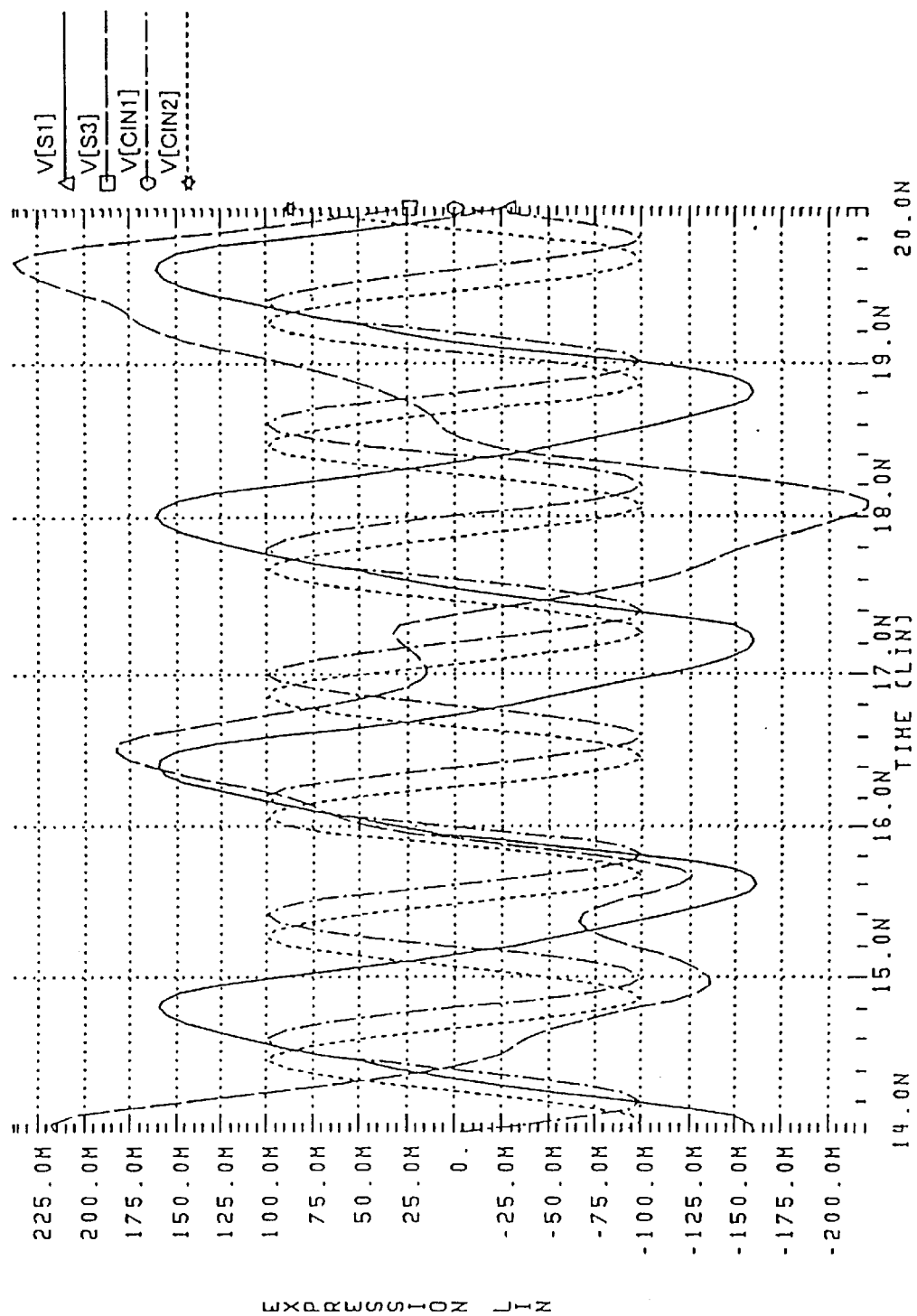
FIG. 7 is a waveform chart for explaining the operations of the circuits shown in FIGS. 2 and 5.

FIGS. 6 and 7 are waveform charts when the ½ frequency dividing circuits in FIGS. 2 and 5 are operated with a clock signal of 1.25 GHz. A solid line V[M1] in FIG. 6 represents an amplitude of voltage at the terminal M1 in FIG. 2, an alternate dashed line V[CIN1] represents the first clock signal, a dotted line V[CIN2] represents the second clock signal and a broken line V[M3] represents an amplitude of voltage at the terminal M3 in FIG. 5. (The same reference numerals refer to the same ones also in the waveform charts hereinbelow.) A solid line V[S1] in FIG. 7 represents an amplitude of voltage at the terminal S1 in FIG. 2 and a broken line V[S3] represents an amplitude of voltage at the terminal S3 in FIG. 5. It is then apparent from the simulation results shown in FIGS. 6 and 7 that the ½ frequency dividing circuit of the present embodiment fully operates even with the clock signal in such high frequency to which the prior art circuit cannot follow. That is, while the ½ frequency dividing circuit of the present embodiment can obtain the outputs having clear waveforms as shown by the solid line V[M1] in FIG. 6 and the solid line V[S1] in FIG. 7, the waveforms of the prior art ½ frequency dividing circuit are distorted and are causing an erroneous operation as shown by the broken line V[M3] in FIG. 6 and the broken line V[M3] in FIG. 7.

Figure 8:
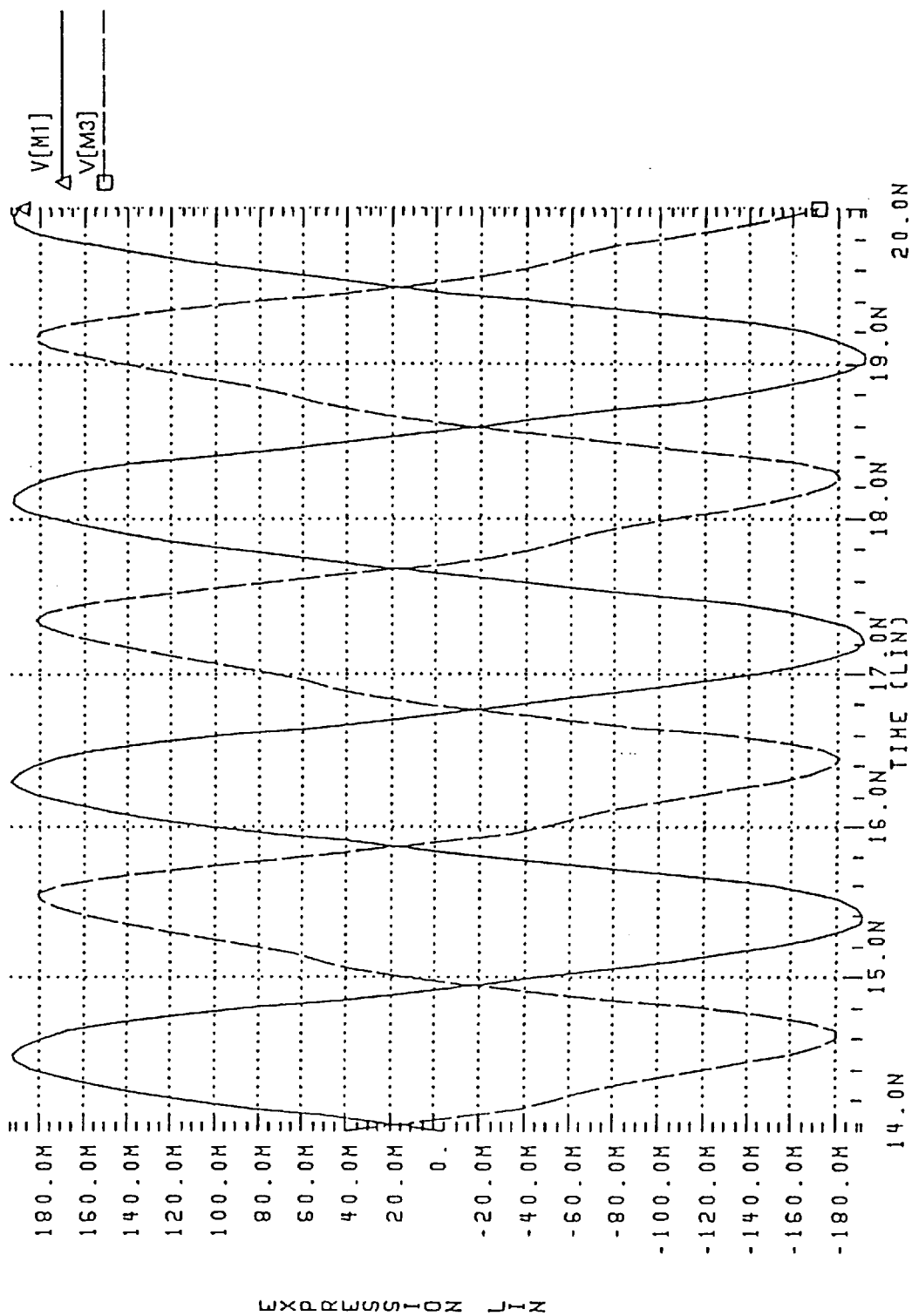
FIG. 8 is a waveform chart for explaining the operations of the circuits shown in FIGS. 2 and 5.

FIG. 8 shows a case when the ½ frequency dividing circuit is operated with a clock signal of 1.1 GHz. This chart shows a comparative result when the ½ frequency dividing circuit of the present embodiment as well as that of the prior art both follow the clock signal in the same manner. It can be seen from the result of this chart that the ½ frequency dividing circuit of the present embodiment can obtain an output having a clearer waveform having no distortion.

Figure 9:
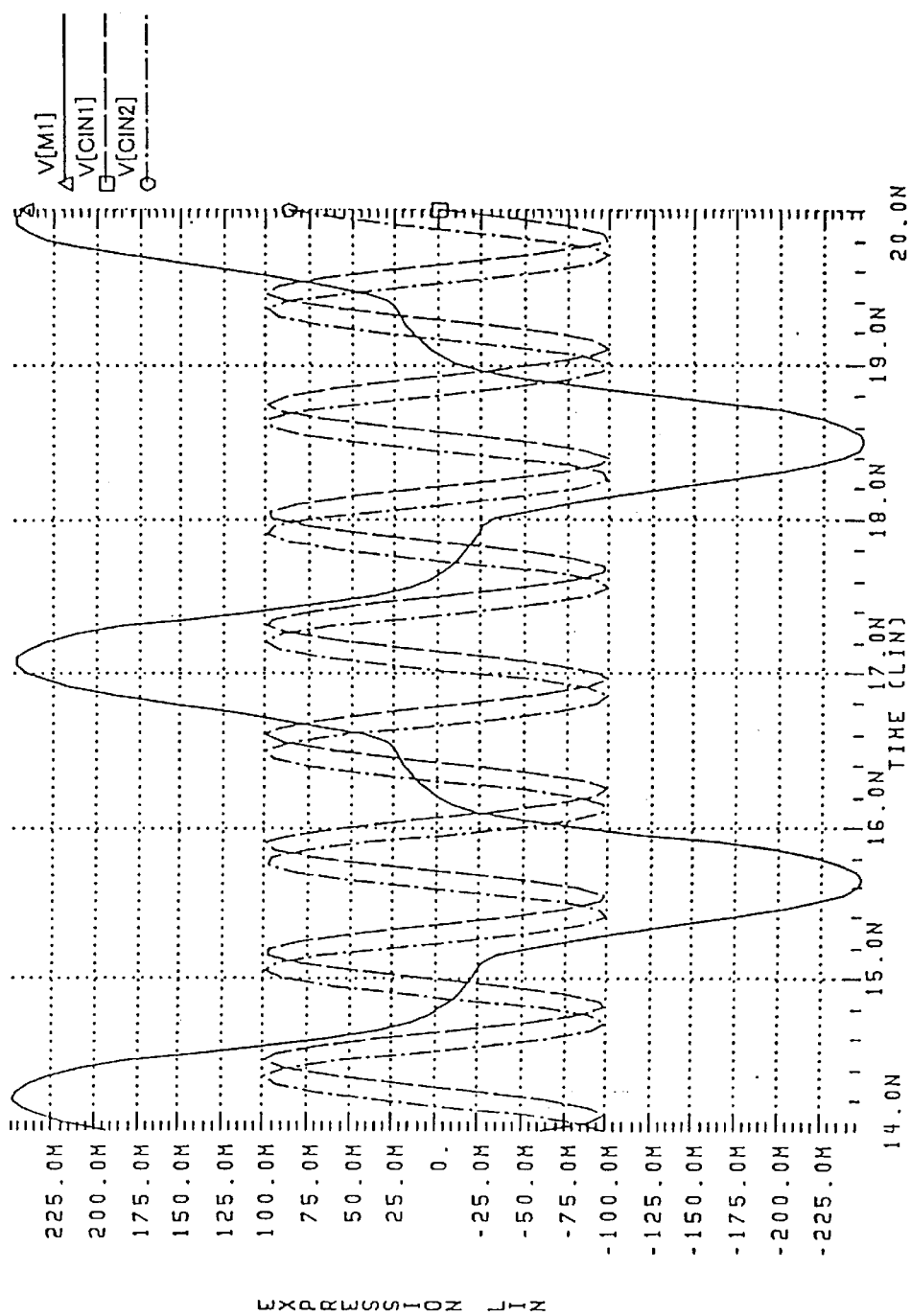
FIG. 9 is a waveform chart for explaining the operation of the circuit shown in FIG. 2.

FIG. 9 shows a case when the ½ frequency dividing circuit of the present embodiment is operated with a clock signal of 1.4 GHz. As shown in the chart, even the circuit of the present embodiment cannot follow such clock signal in this case.

Figure 10:
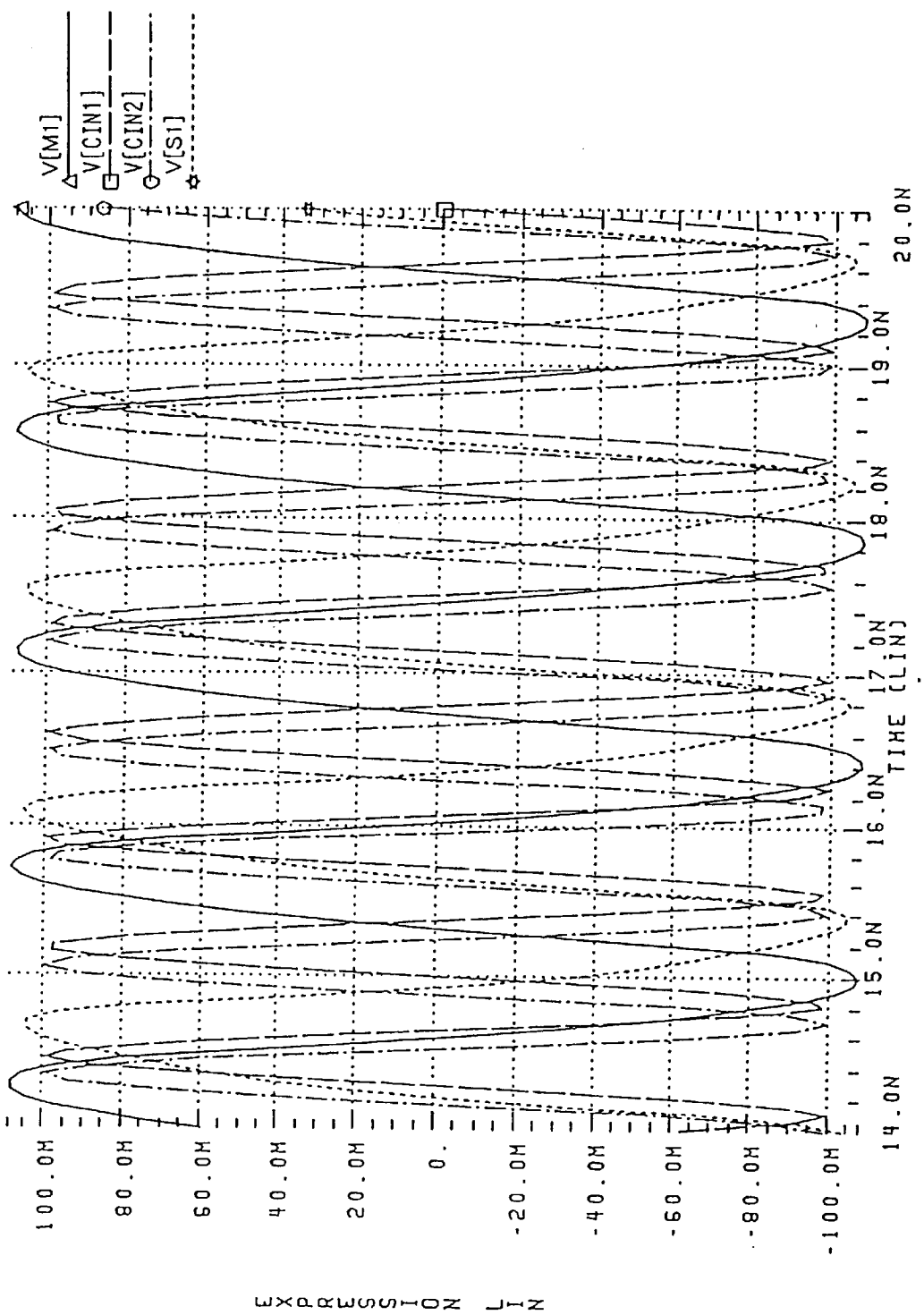
FIG. 10 is a waveform chart for explaining the operation of the circuit shown in FIG. 2.

The above-mentioned simulation results have been obtained by equalizing the value of the current supplied from the first and second current supplying circuits 5 and 6 to the respective differential circuits as 50 $\mu$A. Then, a simulation has been carried out on a case when the ½ frequency dividing circuit is operated with the clock signal of 1.4 GHz by setting the value of current of the first differential circuit 1 as 50 $\mu$A and that of the second current supplying circuit 6 as 30 $\mu$A. As a result, it has been found that the ½ frequency dividing circuit operates even with the clock signal of 1.4 GHz as shown in FIG. 10.

Figure 11:
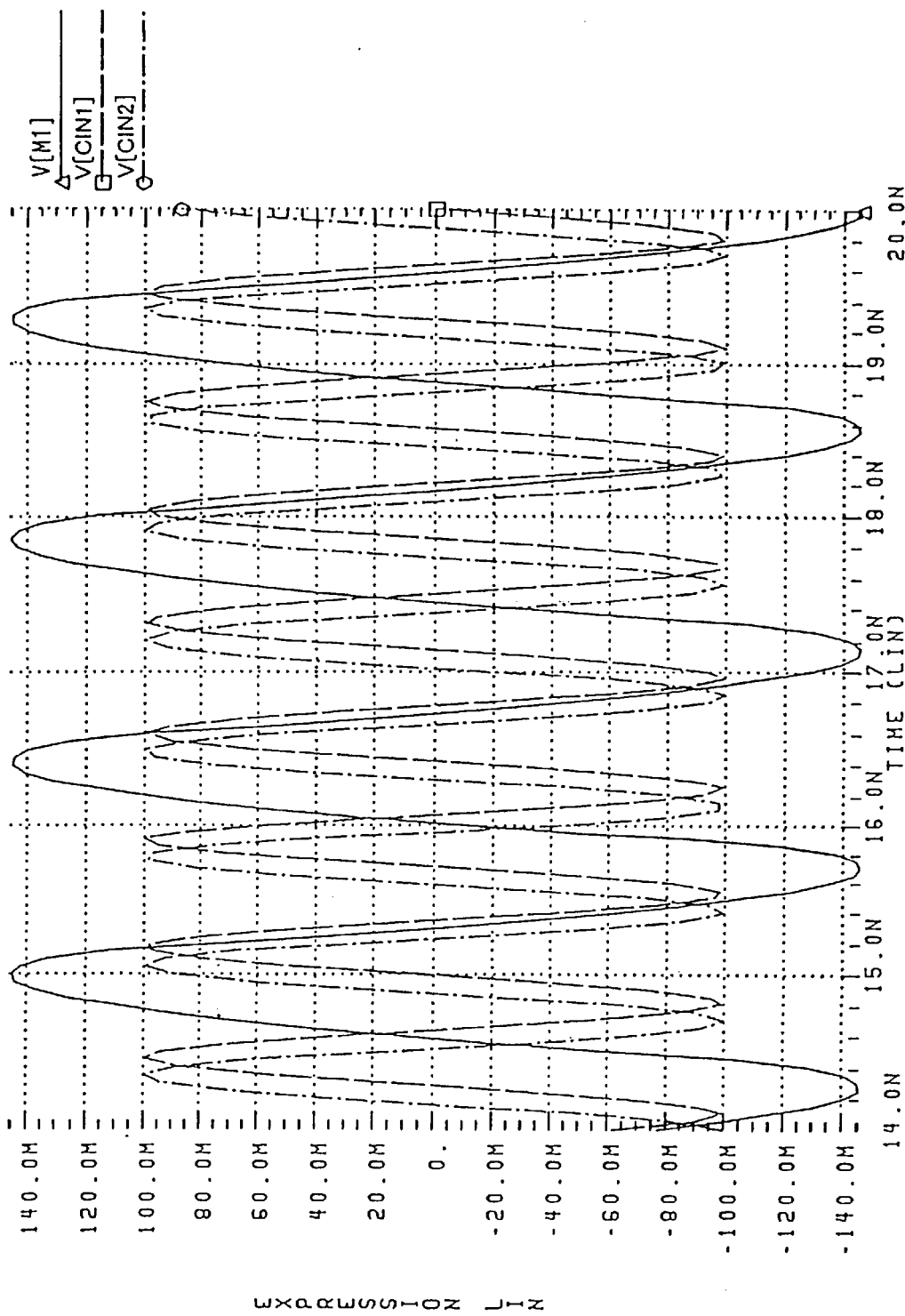
FIG. 11 is a waveform chart for explaining the operation of the circuit shown in FIG. 2.

That is, the present invention is not limited only to the case when the value of the current of the first current supplying circuit 5 is equalized with that of the second current supplying circuit 6. Because it requires less value of current on the level which will not vanish data in holding data like writing data which is not involved with the inverting operation, it is possible to increase operating frequency and to lessen power consumption by reducing the value of the current of the second current supplying circuit 6 to be less than that of the first current supplying circuit 5. The value of the current may be reduced by 20% in the case of FIG. 10. Further, when a simulation has been carried out on a case when the value of the current of the first current supplying circuit 5 is increased more than that of the second current supplying circuit 6 without changing the whole power consumption, it has been found that the ½ frequency dividing circuit of the present embodiment operates even with the clock signal of 1.4 GHz as shown in FIG. 11. This arrangement excels in that a higher amplitude of voltage can be obtained as compared to the case when the power consumption is lowered. It is noted that the simulation shown in FIG. 11 has been carried out by setting the value of the current of the first current supplying circuit 5 at 60 $\mu$A and that of the second current supplying circuit at 40 $\mu$A.

As described above, with respect to the value of the current supplied from the first and second current supplying circuits 5 and 6 to the respective differential circuits, the present embodiment allows the operating frequency to be increased and the value of power consumption to be reduced by setting the value of the current of the second current supplying circuit 6 to be less than that of the first current supplying circuit 5. It is noted that under the conditions of the above-mentioned simulations, it has been possible to set the delay of the first clock signal with respect to the second clock signal at 40 to 120 degrees, or preferably 60 to 90 degrees, in terms of a phase lag.

Next, another embodiment of the present invention will be described.

Figure 12:
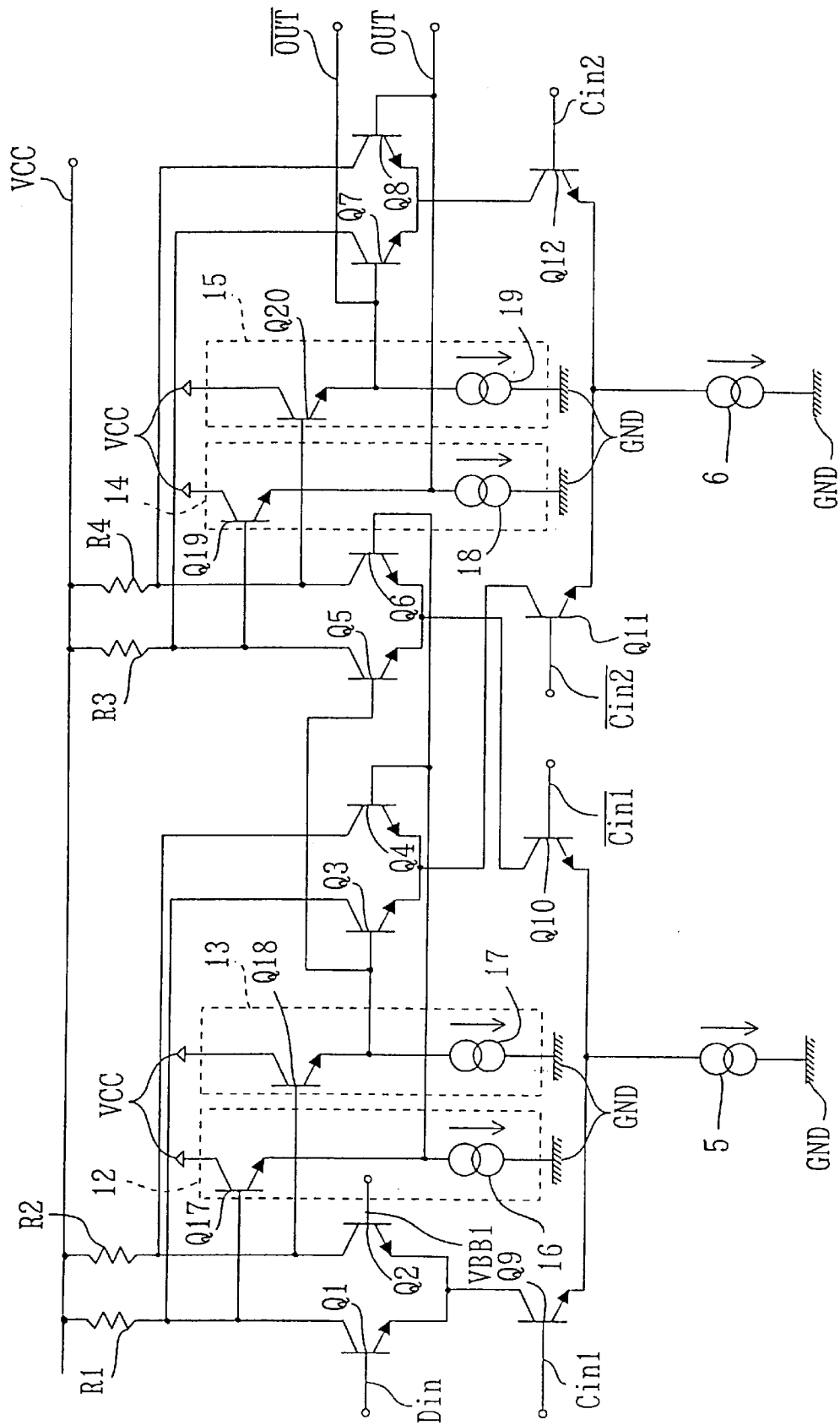
FIG. 12 is a circuit diagram for explaining a structure of a D-type flip-flop circuit according to a second embodiment of the present invention.

Part of the D-type flip-flop circuit of the first embodiment described above may be altered as shown in FIG. 12. In the figure, the same reference numerals with those in FIG. 2 refer to the same components. In the second embodiment, emitter-follower circuits 12 and 13 are provided between the first differential circuit 1 and the second differential circuit 2 and emitter-follower circuits 14 and 15 are provided between the third differential circuit 3 and the fourth differential circuit 4. That is, although there has been a case when signals having a large amplitude are required depending on the latter circuit using the signals of the terminals S1 and S2 in the circuit shown in FIG. 2, there has been a fear that the operation is stopped and the amplitude could not be increased so much because a current value might become too large when the amplitude of the signal is increased too much and a base voltage VBE becomes higher than a collector voltage VCE of a transistor receiving such current. Then, in order to deal with such a case, the emitter-follower circuits 12 through 15 are provided in the present embodiment.

The emitter-follower circuit 12 comprises a transistor Q17 and a current supplying circuit 16. A base of the transistor Q17 is connected to the collector of the transistor Q1, a collector thereof is connected to the source terminal VCC and an emitter thereof is connected to the current supplying circuit 16 as well as to the base of the transistor Q4. The emitter-follower circuit 13 comprises a transistor Q18 and a current supplying circuit 17. A base of the transistor Q18 is connected with the collector of the transistor Q2, a collector thereof is connected with the source terminal VCC and an emitter thereof is connected with the current supplying circuit 17 as well as with the base of the transistor Q3.

That is, data is held through a route from the collector of the transistor Q3 to the collector of the transistor Q1, the base emitter of the transistor Q17 and the base of the transistor Q4 and a route from the collector of the transistor Q4 to the collector of the transistor Q2, the base emitter of the transistor Q18 and the base of the transistor Q3. Thus, the respective holding routes contain the emitter-follower circuits, so that one stage of the base voltage VBE may be dropped between the first differential circuit 1 and the second differential circuit 2, eliminating the above-mentioned trouble.

The output to the third differential circuit 3 is sent from a connecting point of the transistor Q17 and the current supplying circuit 16 and a connecting point of the transistor Q18 and the current supplying circuit 17. The emitter-follower circuits 14 and 15 also respectively comprise transistors Q19 and Q20 and current supplying circuits 18 and 19 each connected in the same manner. While an operation of the present embodiment will not be described specifically in detail, the present embodiment shows almost the same action and effect with those of the first embodiment. Further, because the emitter-follower circuits 12 through 15 are provided, an output having a large amplitude may be sent to the latter circuits.

Figure 13:
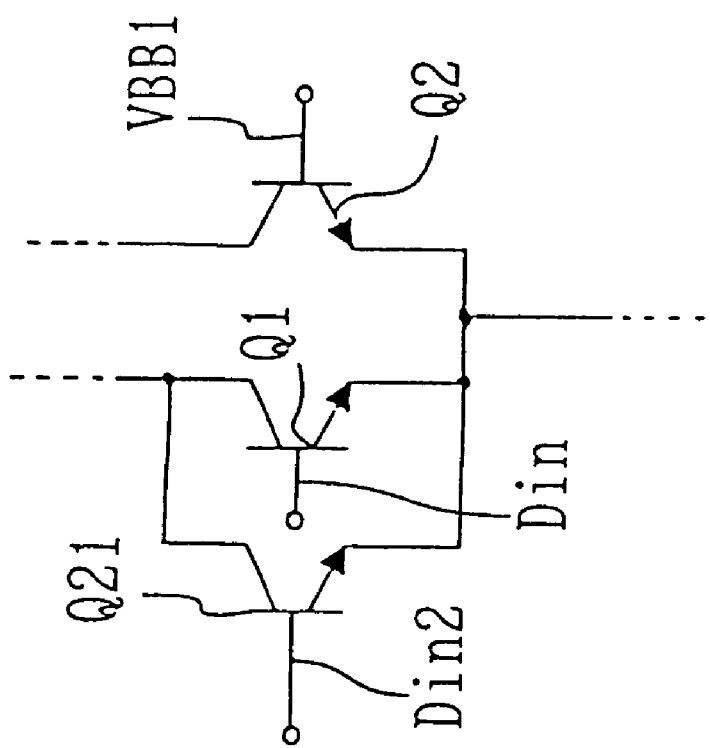
FIG. 13 is a circuit diagram showing a structure of another modified example of the present invention.

Further, although there have been two data input terminals (where, one is used for inputting the reference potential or the inverted signal of the other input data) in each embodiment described above, the present invention is not limited only to such a case. For instance, it is possible to provide a transistor Q21 in parallel to the transistor Q1 and to provide a data input terminal Din2 as shown in FIG. 13 in order to operate a wired OR gate or the like.

Figure 14:
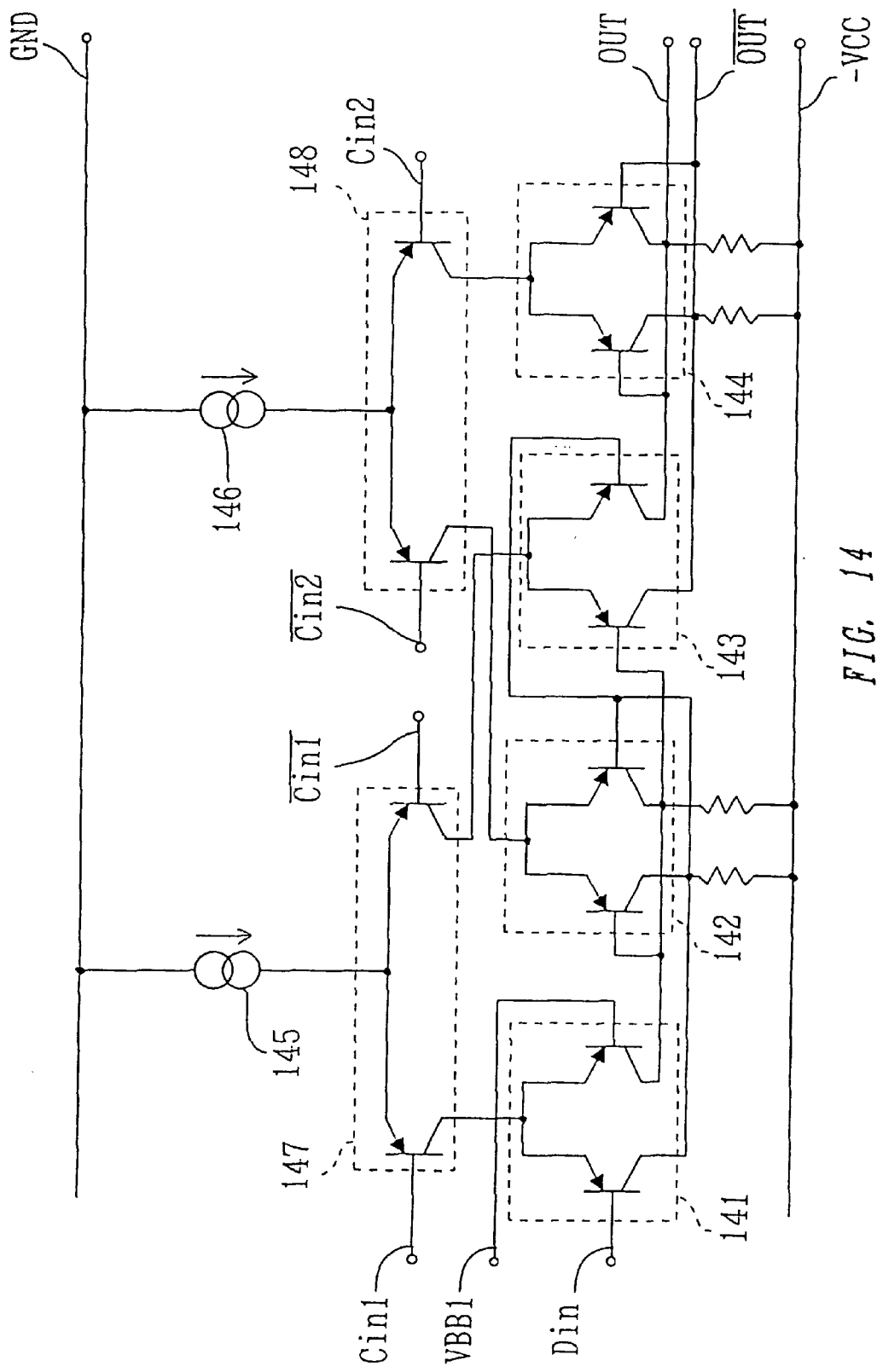
FIG. 14 is a circuit diagram showing a structure of a still modified example of the present invention.

Still more, although all of the ½ frequency dividing circuits have been composed of npn-type bipolar transistors in each embodiment described above, the present invention is not limited only to such a case and the circuit may be composed of pnp-type bipolar transistors. For instance, FIG. 14 shows a circuit in which the pnp-type bipolar transistors are applied to the D-type flip-flop circuit shown in FIG. 2. In this case, the circuit has the similar connection, though the polarity of the power and current sources are inverted. It is noted that the circuit comprises first through fourth differential circuits 141 through 144, first and second current supplying circuits 145 and 146 and first and second switching circuits 147 and 148. It is noted that the data input terminal Din, the clock terminal Cin1, the output terminal OUT and the like are shown in the same manner with those shown in FIG. 2.

Figure 15:
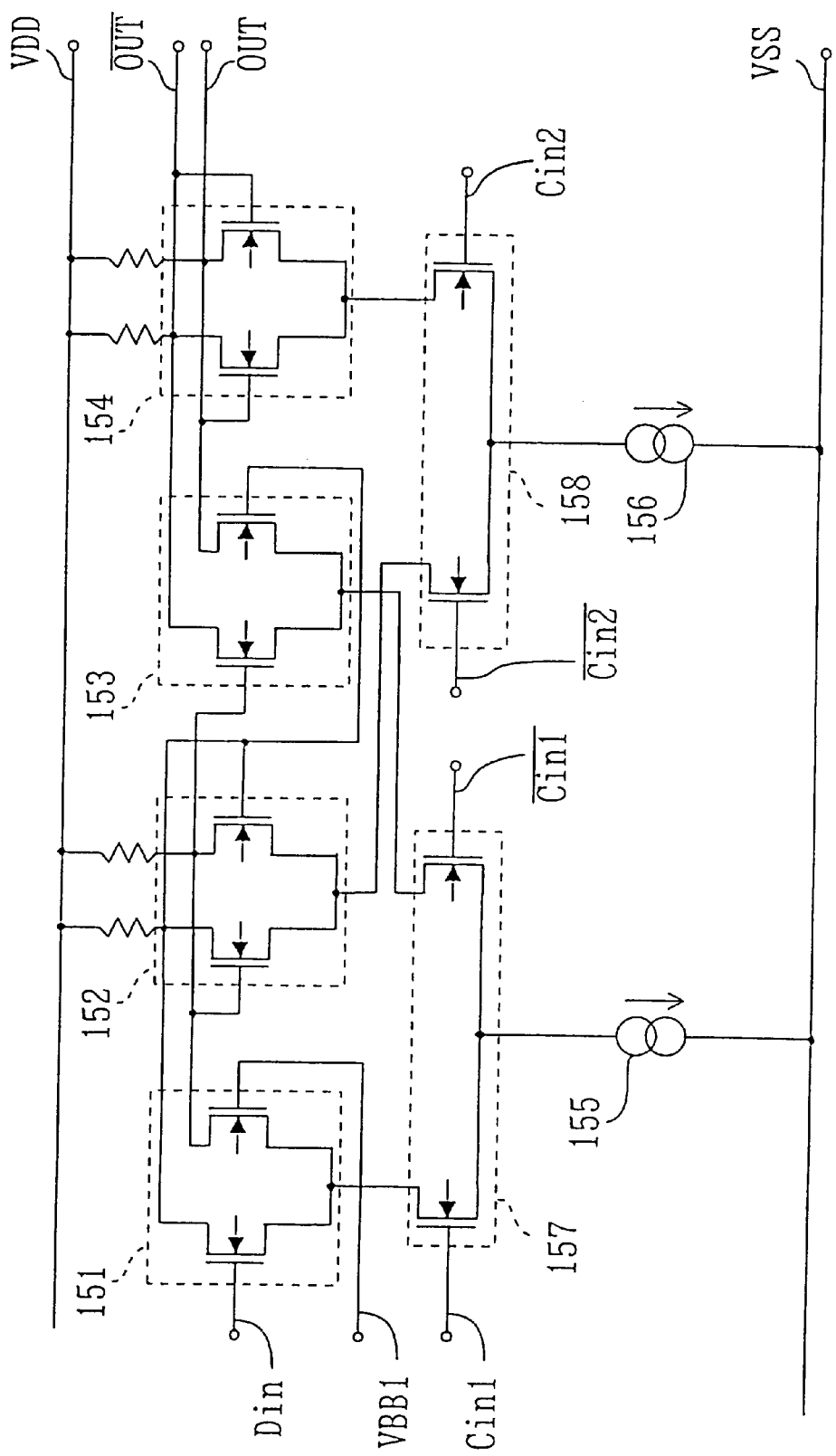
FIG. 15 is a circuit diagram showing a structure of a modified example of the present invention.
Figure 16:
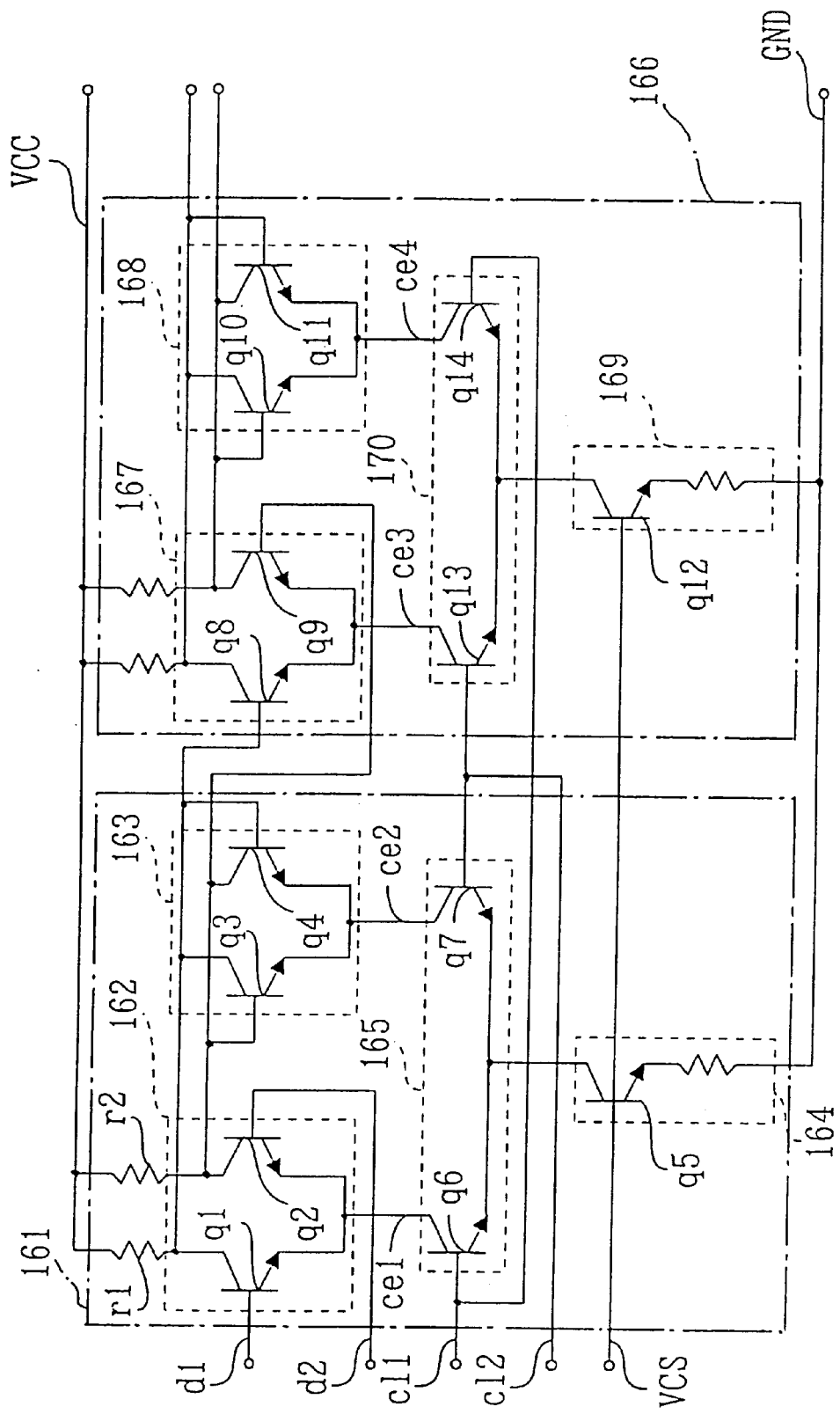
FIG. 16 is a circuit diagram for explaining a structure of a prior art D-type flip-flop circuit.

The inventive circuit may be constructed also by using MOS transistors, instead of the bipolar transistors. For instance, FIG. 15 shows a case when the circuit is constructed by using N channel MOS transistors. In the figure, the circuit comprises first through fourth differential circuits 151 through 154, first and second current supplying circuits 155 and 156 and first and second switching circuits 157 and 158. It is noted that the data input terminal Din, the clock terminal Cin1, the output terminal OUT and the like are shown in the same manner with those shown in FIG. 2. The inventive circuit may be constructed by using P channel MOS transistors, instead of the N channel MOS transistors, also in the circuit composed of the MOS transistors in FIG. 15. Although its example is not shown specifically, the circuit has the same connection with that composed of the N channel MOS transistors, though the polarity of the power and current sources are inverted, similarly to the above-mentioned case of the bipolar transistors.

As described above, according to the invention, the operation timing of the differential circuits for inputting data and for holding data is optimized by dividing the current supplying source to the respective two differential circuits for inputting data (first and third differential circuits) and for holding data (second and fourth differential circuits) of the master circuit and slave circuit, by controlling the timing for supplying the current separately by the first and second clock signals and by arranging the first clock signal so as to have the predetermined delay with respect to the second clock signal. Accordingly, the remarkable effects can be obtained in the aspects of the operating frequency, the waveform in operating in high frequency and the ability for transmitting data. In addition to that, it is possible to increase the operating frequency further and to lower the power consumption by setting the value of the current supplied to the second and fourth differential circuits to be less than that supplied to the first and third differential circuits.

While the preferred embodiments have been described, variations thereto will occur to those skilled in the art within the scope of the present inventive concepts which are delineated by the following claims.

What is claimed is:

1. A D-type flip-flop circuit, comprising:
   a master circuit having a first differential circuit for generating output data corresponding to input data and a second differential circuit for holding and outputting the output data output from said first differential circuit;
   a slave circuit having a third differential circuit for generating second output data corresponding to the output data output from said second differential circuit of said master circuit and a fourth differential circuit for holding and outputting the second output data output from said third differential circuit;

a first current supplying circuit for supplying a first current to said first and third differential circuits;

a second current supplying circuit for supplying a second current to said second and fourth differential circuits;

a first switching circuit for connecting said first and third differential circuits alternately to said first current supplying circuit in response to a first clock signal; and a second switching circuit for connecting said second and fourth differential circuits alternately to said second current supplying circuit in response to a second clock signal;

the first clock signal having a predetermined delay with respect to the second clock signal, wherein said predetermined delay between the first clock signal and the second clock signal is less than 180 degrees.

2. The D-type flip-flop circuit according to claim 1, wherein a value of said second current is smaller than a value of said first current.

3. The D-type flip-flop circuit according to claim 1, wherein, in response to said second clock signal, said second switching circuit starts to supply said second current to said second differential circuit or said fourth differential circuit before the supply of said first current to said first differential circuit or said third differential circuit is stopped and said second switching circuit stops the supply of said second current to said second differential circuit or said fourth differential circuit before said first current is started to be supplied to said first differential circuit or said third differential circuit.

4. The D-type flip-flop circuit according to claim 1, wherein first and second emitter-follower circuits are provided between an output terminal of said first differential circuit and an input terminal of said second differential circuit and between an output terminal of said third differential circuit and an input terminal of said fourth differential circuit, respectively, and a signal which goes through said first emitter-follower circuit is input to the input terminal of said second differential circuit and a signal which goes through said second emitter-follower circuit is output.

5. The D-type flip-flop circuit according to claim 1, wherein said first switching circuit comprises:

a differential circuit having a first terminal and a second terminal, wherein said first terminal receives said first clock signal and said second terminal receives a first inverted signal of said first clock signal.

6. The D-type flip-flop circuit according to claim 1, wherein said first switching circuit comprises:

a differential circuit having a first terminal and said second terminal receives a second terminal, wherein said first terminal receives said first clock signal and a predetermined potential.

7. The D-type flip-flop circuit according to claim 1, wherein said second switching circuit comprises:

a differential circuit having a first terminal and a second terminal, wherein said first terminal receives said second clock signal and said second terminal receives a second inverted signal of said second clock signal.

8. The D-type flip-flop circuit according to claim 1, wherein said second switching circuit comprises:

a differential circuit having a first terminal and a second terminal, wherein said first terminal receives said second clock signal and said second terminal receives a predetermined potential.

* * * * *